(12) United States Patent
Nistler et al.

(10) Patent No.: US 11,226,384 B2
(45) Date of Patent: Jan. 18, 2022

(54) METHOD AND DEVICE FOR MONITORING LOCAL COILS

(71) Applicant: Siemens Healthcare GmbH, Erlangen (DE)

(72) Inventors: Jürgen Nistler, Erlangen (DE); Volker Matschl, Bamberg (DE); Stephan Biber, Erlangen (DE); Rainer Kurth, Erlangen (DE); Christian Wünsch, Röthenbach a.d. Pegnitz (DE); Georg Martschenko, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 11 days.

(21) Appl. No.: 16/708,801

(22) Filed: Dec. 10, 2019

(65) Prior Publication Data

US 2020/0191890 A1 Jun. 18, 2020

(30) Foreign Application Priority Data

Dec. 12, 2018 (DE) .......................... 102018221561.8
Sep. 23, 2019 (EP) ..................................... 19198911

(51) Int. Cl.
*G01R 33/36* (2006.01)
*G01R 33/58* (2006.01)

(52) U.S. Cl.
CPC ....... *G01R 33/3692* (2013.01); *G01R 33/583* (2013.01)

(58) Field of Classification Search
CPC .......................... G01R 33/3692; G01R 33/583
See application file for complete search history.

(56) References Cited

U.S. PATENT DOCUMENTS

| 5,551,430 | A  | * | 9/1996  | Blakeley | ................. | A61B 5/055 |
|           |    |   |         |          |                   | 600/410    |
| 9,201,127 | B2 | * | 12/2015 | Kumar    | ...............   | G01R 33/3628 |
| 2008/0231273 | A1 | * | 9/2008 | Kabasawa | ..............  | G01R 33/56 |
|           |    |   |         |          |                   | 324/309    |

(Continued)

FOREIGN PATENT DOCUMENTS

| CN | 101609132 A | 12/2009 |
| CN | 101644750 A |  2/2010 |

(Continued)

OTHER PUBLICATIONS

Speier, P. et al. "PT-Nav: a novel respiratory navigation method for continuous acquisitions based on modulation of a pilot tone in the MR-receiver" ESMRMB Congress. 2015. pp. S97-S98. (Year: 2015).*

(Continued)

*Primary Examiner* — Gregory H Curran
(74) *Attorney, Agent, or Firm* — Lempia Summerfield Katz LLC

(57) ABSTRACT

A system and method are provided for operating a magnetic resonance tomograph. A transmitter of the magnetic resonance tomograph transmits a predetermined test pulse with a reduced power. The magnetic resonance tomograph receives the test pulse with the local coil. A controller compares the received test pulse with a predetermined pulse response and emits a warning signal when the received test signal differs from the predetermined pulse response.

23 Claims, 3 Drawing Sheets

(56) References Cited

U.S. PATENT DOCUMENTS

| | | |
|---|---|---|
| 2009/0302845 A1 | 12/2009 | Biber |
| 2009/0322329 A1 | 12/2009 | Diehl et al. |
| 2010/0033180 A1 | 2/2010 | Biber et al. |
| 2011/0241680 A1 | 10/2011 | Moessnang et al. |
| 2013/0082707 A1 | 4/2013 | Biber |
| 2013/0342199 A1 | 12/2013 | Bollenbeck et al. |
| 2014/0070807 A1 | 3/2014 | Biber |
| 2017/0042496 A1 | 2/2017 | Shanbhag et al. |
| 2017/0205481 A1 | 7/2017 | Kim |

FOREIGN PATENT DOCUMENTS

| | | |
|---|---|---|
| CN | 102210587 A | 10/2011 |
| CN | 103513197 A | 1/2014 |
| CN | 106462972 A | 2/2017 |
| CN | 108872897 A | 11/2018 |
| DE | 102008026849 A1 | 12/2009 |
| DE | 102011083959 A1 | 4/2013 |
| DE | 102012216292 A1 | 5/2014 |

OTHER PUBLICATIONS

German Office Action for German Application No. 10 2018 221 561.8 dated Sep. 25, 2019.
Schroeder, Lea, et al. "A novel method for contact-free cardiac synchronization using the pilot tone navigator." 24th ISMRM Annual Meeting and Exhibition. 2016. pp. S97-S98.
Chinese Office Action for Chinese Application No. 201911248262.9 dated Nov. 1, 2021, with English translation.

* cited by examiner

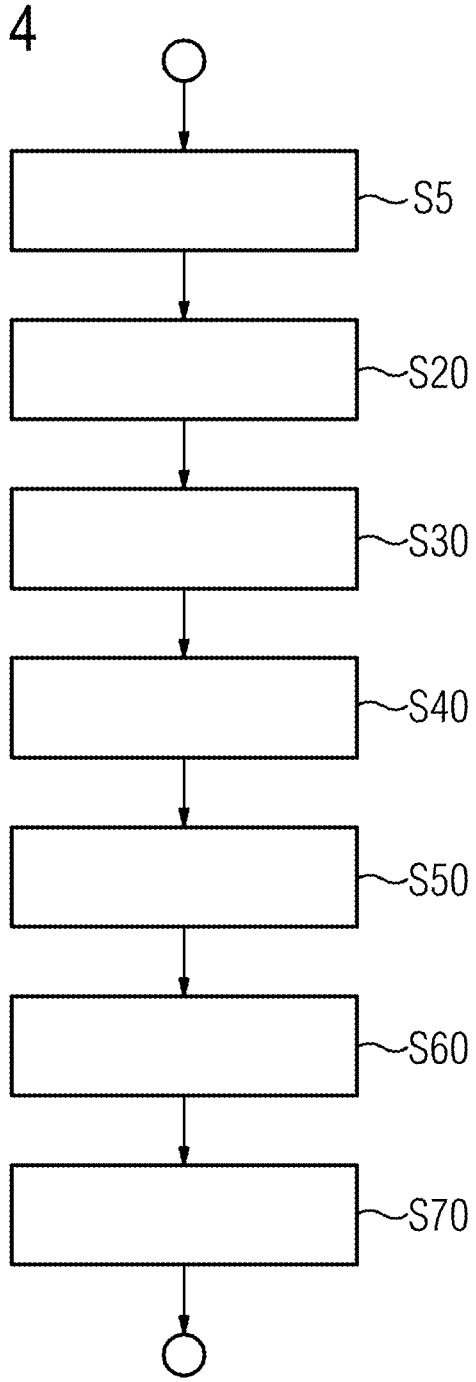

METHOD AND DEVICE FOR MONITORING LOCAL COILS

CROSS REFERENCE TO RELATED APPLICATIONS

This application claims the benefit of DE 102018221561.8, filed on Dec. 12, 2018 and EP 19198911.0 filed on Sep. 23, 2019, both of which are hereby incorporated by reference in their entirety.

FIELD

Embodiments relate to a method for operating a magnetic resonance tomograph.

BACKGROUND

Magnetic resonance tomographs are imaging devices that, for depicting an examination object, orient nuclear spins of the examination object with a strong external magnetic field and using a magnetic alternating field excite them to precession around the orientation. The precession or return of the spins from the excited state into a state with lower energy in turn generates as a response a magnetic alternating field that is received via antennas.

A spatial encoding is impressed on the signals with the aid of magnetic gradient fields and subsequently provides an allocation of the received signal to a volume element. The received signal is then evaluated, and a three-dimensional imaging representation of the examination object provided.

To achieve an optimum Signal-to-Noise Ratio (SNR), it is desirable to arrange the antenna coils for reception as close to the patient as possible. This is done with local coils, that are connected by cable connections to the magnetic resonance tomograph. Due to the high fields when exciting the nuclear spins, defective local coils may also become a danger to the patient, however, if safety devices fail.

BRIEF DESCRIPTION AND SUMMARY

The scope of the present invention is defined solely by the appended claims and is not affected to any degree by the statements within this summary. The present embodiments may obviate one or more of the drawbacks or limitations in the related art.

Embodiments provide the use of the local coils safer.

A method is provided for operating a magnetic resonance tomograph including a controller, a local coil, and a transmitter for transmitting a test pulse.

The magnetic resonance tomograph transmits, with the transmitter, a predetermined test pulse with reduced power via a transmitting antenna. A transmitter of the magnetic resonance tomograph is configured for transmitting excitation pulses with powers of hundreds of watts to a few kilowatts and to generate predetermined test pulses with powers of fractions of a watt up to a few watts with sufficient linearity and frequency unit, for example as the switching is sufficiently linear or a plurality of transmit modules may be individually activated for different power ranges. A damping unit as part of the transmitter may be used that reduces the generated signals into the desired power range. A specific transmitter may also be provided in the magnetic resonance tomograph purely for the generation of the test pulse.

The transmitting antenna may be, for example, the body coil of the magnetic resonance tomograph. A separate transmitting antenna may be used. A power of less than 0.1 watt, 1 watt or 5 watt is regarded as a reduced power. The reduced power may likewise be provided by the amplitude of the test pulse applied at the transmitting antenna, wherein the effective voltage is less than 0.5 v, 1 v, 5 v or 15 v.

The local coil receives the test pulse. The received test pulse may be pre-prepared in the local coil, for example amplified and converted in frequency, or also be digitized. The local coil includes a signal link to a receiver of the magnetic resonance tomograph that takes over further evaluation.

The local coil and/or the receiver passes the received test pulse on to the controller, that compares the test pulse with a predetermined pulse response. The predetermined pulse response may be a threshold value or desired value with which the controller compares the test pulse. A test pulse received at an earlier instant is also possible as a comparative value. A predefined pulse curve over time with time-dependent values may be used that may be indicated for example in the form of an equation or table. "Comparing" may signify whether the values are equal to, less than or greater than the desired value. Comparing may also refer to using metrics, for example a maximum interval that must not be exceeded may be determined. The sum of the inverse squares may form for all instants.

The controller emits a warning signal when the received test signal deviates from the predetermined pulse response, for example if a threshold value is exceeded or falls below or the previously indicated sum of the inverse squares exceeds a threshold value. The warning signal may for example cause the controller to block subsequent examinations to prevent endangering the patient.

The method provides the function of a local coil to be monitored without complex additional instruments and guarantees the function and safety of the local coil in connection with the magnetic resonance tomograph at any time.

The magnetic resonance tomograph shares the advantages of the method.

In an embodiment of the method the predetermined test pulse includes an amplitude von 0 volt. The transmitter is connected to the antenna and is adjusted when emitting an excitation pulse, although the transmitter does not receive an input signal or one with a constant amplitude. The transmitter does not actively transmit a radio frequency, but the transmitter is electrically connected to the antenna and the background noise of the transmitter is emitted. The predetermined pulse response includes an elevated noise level. A correspondingly higher noise level in this case of a test pulse with amplitude is expected on the receive side. If the noise does not increase by the expected value, then the preamplifier may be defective.

A test pulse with a lower amplitude provides a basic function of the local coil to be checked with minimum RF emission.

In an embodiment of the method an amplitude of the test pulse increases over the duration of the test pulse from a lower start value to a higher stop value. A power of less than 0.1 watt, 0.5 watt or 1 watt, for example, may be a low start value. The lower start value may also be given by the amplitude of the test pulse applied at the transmitting antenna, where the, for example, effective voltage is less than 0.1 v, 0.5 v or 1 v. The amplitude increases over the time curve of the test pulse to a higher stop value. A power of more than 1 watt, 2 watt, 5 watt or 10 watt, for example, may be a higher stop value. The higher stop value may be given by the amplitude of the test pulse applied at the transmitting antenna, where, for example, the effective voltage is greater than 1 v, 2 v, 5 v or 10 v. The curve may increase monotonously, for example increase linearly with time. The increase may be exponential, logarithmic, in stages or may be configured with intermittent drops in the amplitude.

An increase in the amplitude when a malfunction of the local coil has been identified provides a cut off even at a lower power before further damage may occur. A linear increase provides a simple comparison with the predetermined test response. An exponential increase in turn provides a greater operating sphere to be monitored in a short time. Conversely, a logarithmic increase results in a linear increase in a diode in the local coil, so the function of a PIN diode or protective diode may be easily checked.

In an embodiment of the method the local coil includes a detuning device. The detuning device includes for example a variable capacitance in the form of a PIN diode or a switchable capacitance or capacitance that may be changed in some other way. The detuning device is configured, in the activated state, to match a resonance frequency of the local coil to a frequency that is not equal to the frequency of the excitation pulse for the nuclear spins, so no dangerous voltages are induced in the local coil by the excitation pulse. The detuning device of the local coil is activated during the step of reception.

The function of the detuning device results in a lower amplitude of the received test pulse that may be verified with a correspondingly lower predetermined pulse response and guarantees the function of the detuning device.

In an embodiment of the method the predetermined pulse response includes a threshold value. A single constant value for an amplitude of the pulse response may be the threshold value. Depending on the setting of the local coil and of the test pulse, exceeding or falling below the threshold value may indicate malfunctioning of the local coil. If, for example, the detuning device is activated during the test pulse, then exceeding of the threshold values may indicate malfunctioning of the detuning device. Malfunctioning of a fuse may also be identified. Conversely, falling below the threshold value may indicate, for example, malfunctioning of an input amplifier.

A threshold value provides a straightforward possibility, by way of a simple switching circuit or, in digital implementation, a comparator, of verifying a function of the local coil.

In an embodiment of the method the predetermined pulse response is proportional to the test pulse. At any instant of the test pulse a quotient of test pulse is substantially constant in relation to the temporally allocated value of the pulse response. A deviation by less than 20%, 10%, 5% or 1% of the average quotient is regarded as substantially constant.

In reception mode a local coil must firstly exhibit optimally linear behavior that may be verified by the proportionality of test pulse to predetermined pulse response and the receive signals compared with it.

In one embodiment the method is provided for checking a detuning device of an antenna coil of a magnetic resonance tomograph. With the detuning device there is the possibility of purposefully activating the detuning device using a control signal. The control signal may be for example a direct voltage or a direct current, that is applied to the detuning device, as is conventional with PIN diodes or switches. The control signal may also be a different analog or digital signal, however, that in a control device of the detuning device results in detuning of the antenna coil.

What is not regarded as activation of the detuning device is, for example, if a signal, e.g. a radio frequency signal induced in the antenna coil, that, due to the induced voltage, might itself result in a risk to the patient, activates the detuning device, as is the case for example with a passive fuse or Zener diode. The detuning device results in a shift of a resonance frequency of the antenna coil, it still being possible to receive a radio frequency signal by way of a connected receiver. The detuning device may be implemented for example by capacitance-changing diodes or switchable inductances or capacitances in a parallel or series resonance circuit of the antenna coil. The detuning device may also include a passive component that limits the induced voltage or current. Detuning diodes for example may be used, that are detuned by an induced, rectified voltage without external control signal, or cross-switched diodes or Zener diodes, that short-circuit an induced voltage above a limit value.

In one step of the method the detuning device of the antenna coil is activated, for example by applying a voltage of the one current or by way of a different control signal to the control device of the antenna coil.

In another step a receiver receives a first receive signal of the antenna coil with activated detuning device. A radio frequency current signal and/or voltage signal is regarded as a receive signal that reaches the receiver processed and/or digitized analogously or also in an analog manner. The receive signal may include information on amplitude, phase, and/or spectral distribution. The receiver may be a dedicated receiver for checking the detuning device but may be a receiver of the magnetic resonance tomograph that is also used for receiving magnetic resonance signals for imaging by the magnetic resonance tomograph.

In a step, a second receive signal of the antenna coil is received with the receiver. The detuning device may be activated or inactivated.

In another step a test control compares the first receive signal with the second receive signal. The test control may be, for example, the controller of the magnetic resonance tomograph or an image evaluation or also a dedicated processor. Calculation of the difference or quotient, for example, and comparison with predetermined differential values or quotients or relation of average or maximum amplitudes or energy may be a comparison of the first and the second receive signal. The comparison may not be limited to exact values, but may also be defined by value ranges, that are for example up to 5%, 10%, 20%, or 50% of one of the two values of the first or second receive signal or in the case of quotients differ by a factor of less than 0.1, 0.2, or 0.5 from a value 1. Further mathematical calculations on the relations during the course of the comparison may also be performed.

If the result of the comparison does not match a predetermined value range, the controller emits a warning signal to a user via an output apparatus and/or interrupts further image acquisition.

A change over time in the input signal, such as a damping, may be dependent on the activated detuning device and the function of the detuning device may be inferred by way of the comparison of the two receive signals. This provides fast checking of the detuning device.

In an embodiment, the method includes a step of deactivating the detuning device. The step of reception of the first receive signal takes place with activated detuning device and the step of reception of the second receive signal takes place with the detuning device switched off. In the comparison step a noise level of the first receive signal is compared with a noise level of the second receive signal. For example, the amplitude or energy of the noise may be compared by calculating the difference or quotient. The result may be depicted using logarithmizing in a larger dynamic range. A spectral distribution of the energy of the noise may be used that is caused by a change in a resonance frequency due to the detuning device.

The comparison of two receive signals with activated and with deactivated detuning device allows functioning of the active parts of the detuning device to be easily checked.

In one conceivable embodiment of the method a transmitter of the magnetic resonance tomograph transmits a small signal during the step of reception of the first receive signal and the second receive signal. A small signal is deemed to be when the amplitude of the test pulse is sufficiently low to rule out secondary damage to the local coil or risk to the patient and to not override the receiver in the event of a defective local coil. The small signal or the test pulse must have a low or reduced power. A power of less than 0.1 watt, 1 watt or 5 watts is regarded as a reduced power. The reduced power may likewise be given by the amplitude of a test pulse present at a transmitting antenna, where, typically, the effective voltage is less than 0.5 v, 1 v, 5 v or 15 v.

For example, a separate signal source may be provided as a transmitter for generating the small signal.

As the small signal does not override the receiver, the method may detect also small differences in the comparison of the first receive signal and the second receive signal, such as, for example a slight attenuation or a change in a spectral distribution.

In an embodiment of the method the transmitter is provided for generating excitation pulses of the magnetic resonance tomograph for generating the small signal. The transmitter includes a switchable damping device between a signal generation and a power output stage, that, during the steps of reception, is configured to damp an input signal of the power output stage such that the transmitter does not override the receiver. The transmitter must have correspondingly linear circuitry to be able to also generate correspondingly small signal strengths proportionally and with sufficiently small distortions and low noise. The switchable damping device may be provided for example to reduce the input signal by 40 dB, 60 dB, 80 dB, 100 dB, or more, so the transmitter also generates a correspondingly reduced output signal. a corresponding damping element on the output side may also be provided so the demands on the linearity of the power output stage are reduced.

Use of the transmitter for generating the excitation pulse when checking the detuning device provides for straightforward integration of the tests in existing hardware.

In an embodiment of the method, the transmitter, for generating excitation pulses of the magnetic resonance tomograph, is provided for generating the small signal too. During the step of reception of the first receive signal and of reception of the second receive signal, no input signal is supplied at the power output stage. In other words, generation of the excitation signal is interrupted or a signal with constant output value is generated. The connection may be interrupted between a signal generation and the power output stage or connect the input of the power output stage to a constant potential. The power output stage then generates a noise at the output, that is emitted as a small signal in the test method.

Use of the noise of the power output stage also makes it possible to generate and emit a small signal with the transmitter without modifications of the transmitter, and thereby facilitates the implementation of a test method.

In an embodiment of the method a signal source as a transmitter for the small signal is arranged in the patient tunnel during the step of reception of the first receive signal and the second receive signal. The signal source emits a small signal. The power of the small signal changes between the step of reception of the first receive signal and the step of reception of the second receive signal by a predetermined amount. The frequency of the radio frequency alternating field may be equal to the Larmor frequency or in a range close to the Larmor frequency.

A predetermined change in size of the small signal provides a possibility of identifying the small signal and/or of eliminating background signals. Furthermore, the effectiveness of passive elements of the detuning device may also be checked, for example by non-linear behavior of the receive signals.

In an embodiment of the method an active transmitter of the magnetic resonance tomograph generates the signal. A transmitter or oscillator, that reflects not just one irradiated radio frequency or buffers and then emits it as a radio frequency current in a resonance circuit or in an excited quanta state but generates a radio frequency signal from a current supplied by an energy source via an electrical conductor, is an active transmitter. The signal is a small signal, that does not override the receiver. A test control activates the transmitter in one step to change the power. For example, a test control may increase or reduce an amplification in the transmitter between reception of the first receive signal and reception of the second receive signal. The test control may also change an amplitude of an input signal of the transmitter.

The signal may be changed in a predetermined manner by the test control, so amplitudes may be adjusted at which the detuning device and its correct function become noticeable in different ways, for example by non-linearity or predetermined damping or energy consumption.

In an embodiment of the method the transmitter is a passive signal source, for example a resonator or also an object with nuclear spins, that are temporarily excited by a radio frequency excitation signal of the magnetic resonance tomograph in order to emit a magnetic alternating field, that then drops exponentially with time and in a predetermined manner due to the damping. A radio frequency signal or magnetic resonance signal that drops over time is generated as a small signal between the step of reception of the first receive signal and the step of reception of the second receive signal.

A passive signal source as the transmitter advantageously does not require any changes or only requires minimal changes to the magnetic resonance tomograph and may still provide a test signal in the desired frequency range of the Larmor frequency and with a small amplitude suitable for the receiver.

In one embodiment a magnetic resonance tomograph is provided for carrying out the method. The magnetic resonance tomograph includes a controller, a local coil, a transmitter, and a transmitting antenna for transmitting excitation pulses. The transmitting antenna may be the body coil, for example in the form of a birdcage.

Furthermore, the transmitter includes a small signal path that allows a direct supply of a small signal into the transmitting antenna. For example, to provide the excitation pulse the transmitter may include a signal generation with an oscillator, mixer, or modulator, with which a base frequency is modulated with a modulation signal in amplitude and frequency curve. This may take place in an analog or digital manner. Before amplification by a power output stage, a digital-to-analog conversion takes place by way of an AD converter. As a small signal path, the magnetic resonance tomograph includes a signal link between signal generation and the transmitting antenna, for example the birdcage. The small signal may include a level less than +30 dBm, 10 dBM, 0 dBm, or −10 dBm.

Two signal generators or one signal generator with two signal outputs with different phase, for example offset by 90 degrees, may be provided. A circular modulation with reduced level may also be provided by a two-channel small signal link with a birdcage antenna.

With little effort a small signal may be provided for checking purposes in the case of low background noise.

In an embodiment of the magnetic resonance tomograph the small signal path provides a direct connection between a radio frequency source of the transmitter with the transmitting antenna by avoiding a power output stage. Electronic or mechanical switches provide switching over of the signal path under the control of the controller.

Avoidance of the power amplifier provides for this to be used unchanged, for example, without expensive and efficiency-reducing measures for linearization, in a magnetic resonance tomograph.

In an embodiment of the magnetic resonance tomograph, small signal path includes a small signal amplifier and/or a damping element. The damping or amplification thereof may be changed or switched by the controller.

A switchable amplification provides for the signal to be reduced down to the noise limit, for example, or to be increased in non-linear regions of diodes and provides for other functions of the local coil to be checked.

In an embodiment of the magnetic resonance tomograph the controller is configured to induce, by way of the small signal path and the transmitting antenna, transmission of a predetermined test pulse with reduced power and to receive the test pulse via the local coil. The controller is also configured to compare the received test pulse with a predetermined pulse response. The predetermined pulse response may be stored for example as a value, value range, or value table or be defined by calculation by a function or relation in the controller as a function of the test pulse. If the received test pulse differs from the predetermined pulse response, because for example the amplitude is too high due to a faulty detuning device or is too low in the case of an interruption of a signal line, the controller outputs a warning signal, that is output for example to a user via an operating interface or immediately stops image acquisition.

The small signal path improves and expands the checking options of the magnetic resonance tomograph and thus increases safety and reliability.

In an embodiment of the magnetic resonance tomograph the magnetic resonance tomograph includes a directional coupler and a test switch with a signal link to the small signal path and the directional coupler. The controller may be configured such that in an additional test step it supplies the test signal from the small signal path via the test switch into the directional coupler and compares an output signal of the directional coupler with a predetermined value. For example, a drift of a directional coupler may be identified by way of deviation in the amplitude.

The small signal path with the test switch also allows a directional coupler to be tested and the correct functioning of SAR monitoring and the safety of the patient to be guaranteed.

In an embodiment the magnetic resonance tomograph includes a test device for testing a detuning device of an antenna coil of the magnetic resonance tomograph with a test control. The test control may be a dedicated processor or logic module, but also a processor of the magnetic resonance tomograph, that using a program takes over the function in addition to image acquisition. The test control is configured to activate the detuning device of the antenna coil, to receive a first receive signal with a receiver, to receive a second receive signal with the receiver, to compare the first receive signal with the second receive signal and to output a warning signal if the result of the comparison does not match a predetermined relation for the first receive signal to the second receive signal. The warning signal may be output to a user on a display for example or to the controller of the magnetic resonance tomograph in order to stop further image acquisition.

DESCRIPTION OF THE FIGURES

FIG. 4 depicts an example schematic flowchart for a method.

DETAILED DESCRIPTION

Figure 1:
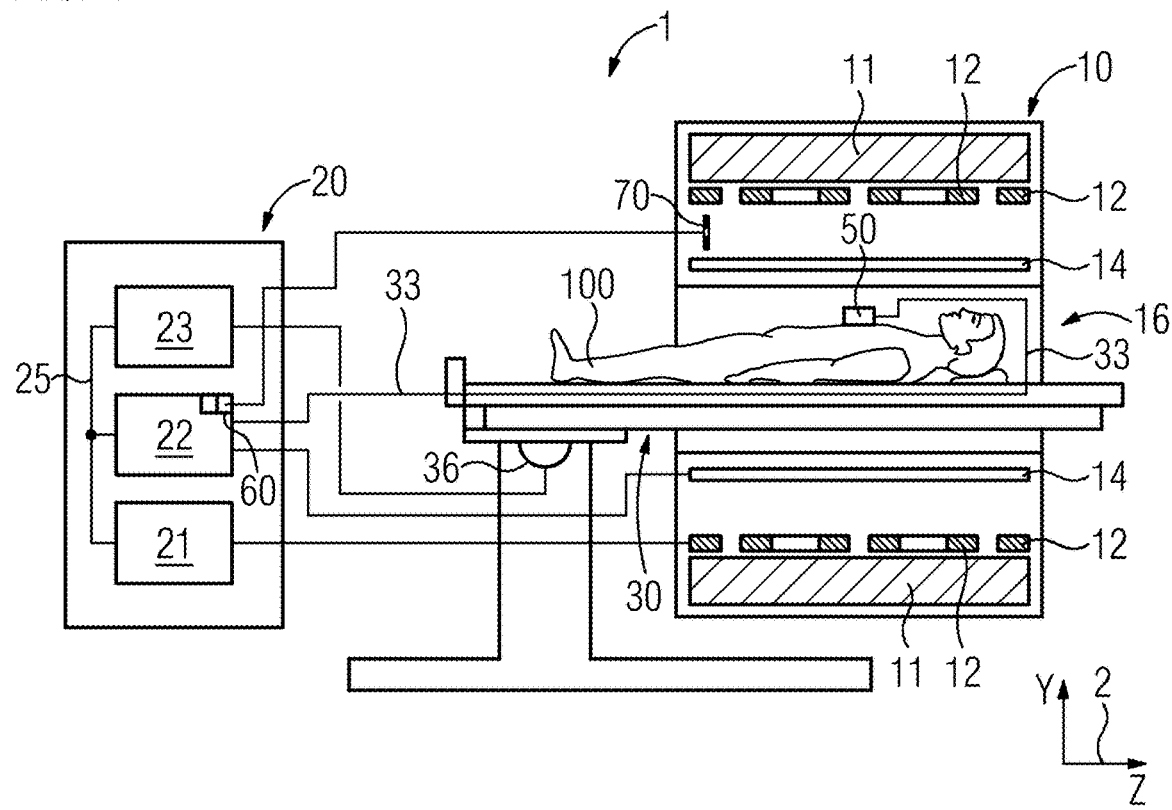
FIG. 1 depicts an example schematic representation of a magnetic resonance tomograph with a local coil.

FIG. 1 depicts a schematic representation of an embodiment of a magnetic resonance tomograph 1 with a local coil 50.

The magnetic unit 10 includes a field magnet 11 that generates a static magnetic field BO for orientation of nuclear spins of samples or of the patient 100 in a recording region. The recording region is distinguished by an extremely homogeneous static magnetic field BO, with the homogeneity relating to the magnetic field strength or the amount. The recording region is almost spherical and arranged in a patient tunnel 16 that extends through the magnetic unit 10 in a longitudinal direction 2. A patient couch 30 may be moved in the patient tunnel 16 by the positioning unit 36. The field magnet 11 is conventionally a superconducting magnet that may provide magnetic fields with a magnetic flux density of up to 3T or more. For lower field strengths, permanent magnets or electromagnets with normal-conducting coils may also be used.

The magnetic unit 10 includes gradient coils 12 that for spatial differentiation of the acquired imaging regions in the examination volume are configured to overlay variable magnetic fields on the magnetic field BO in three spatial directions. The gradient coils 12 are conventionally coils made from normal-conducting wires that may generate mutually orthogonal fields in the examination volume.

The magnetic unit 10 also includes a body coil 14 that is configured to irradiate a radio frequency signal supplied by a signal line into the examination volume and to receive resonance signals emitted by the patient 100 and emit them via a signal line.

A control unit 20 supplies the magnetic unit 10 with the various signals for the gradient coils 12 and the body coil 14 and evaluates the received signals.

The control unit 20 includes a gradient control 21 that is configured to supply the gradient coils 12 via feed lines with variable currents, that provide the desired gradient fields in the examination volume so as to be coordinated timewise.

The control unit 20 includes a radio frequency unit 22 that is configured to generate a radio frequency pulse with a predefined time curve, amplitude, and spectral power distribution to excite a magnetic resonance of the nuclear spins in the patient 100. Pulse powers in the region of kilowatts may be attained. The excitation pulses may be irradiated by way of the body coil 14 or a local transmitting antenna into the patient 100.

A controller 23 communicates via a signal bus 25 with the gradient control 21 and the radio frequency unit 22.

Arranged on the patient 100 is a local coil 50 that is connected by a connecting line 33 to the radio frequency unit 22 and its receiver.

Due to the immediate proximity to the patient a defective local coil 50 presents a danger if, for example, systems for detuning the local coil 50 are defective and excessive voltages and/or currents are induced in the local coil during the excitation pulse. The local coil 50 is also susceptible to defects due to permanent movement, attachment, and detachment of the connection. The fundamental functions of the local coil 50 may be tested at least before every image acquisition in the configuration provided for image acquisition with the magnetic resonance tomograph.

For the test, the controller 23 causes the radio frequency unit 22 to emit a test pulse with predetermined properties. Depending on the type of test pulse, as presented in detail below, different faults in a local coil 50 may be identified or ruled out thereby. Common to all test scenarios, however, is that the amplitude of the test pulse is sufficiently low to rule out secondary damage to the local coil 50 or risks to the patient in the case of a defect in the local coil. The test pulse must have a low or reduced power. A power of less than 0.1 watt, 1 watt or 5 watts is regarded as a reduced power. The reduced power may similarly be given by the amplitude of the test pulse present at the transmitting antenna where the effective voltage is less than 0.5 v, 1 v, 5 v or 15 v.

To generate a test pulse with power reduced either the radio frequency unit 22 has to be configured to also generate, in addition to the excitation pulses in the power range of several hundred watts up to kilowatts, the predetermined test pulses in the watt range or there below, for example by using correspondingly linear circuitry, flexibly coupling power stages in different power ranges or providing sufficiently strong damping of the high output signal. The radio frequency unit 22 may also include a separate test transmitter 60 for generating the test pulse.

Using a small signal path or a bypass to the power stage of the radio frequency unit 22, a control signal for the power stage as the test transmitter 60 a small signal is directly supplied to the transmitting antenna. The small signal path may be connected by a mechanical or electronic switch to protect the test transmitter 60 from damage during an excitation pulse.

If the control signal for the power stage has inadequate power in its function as a test transmitter, the small signal path may include a small signal amplifier that includes sufficient linearity even with low power. Conversely, in the case of excessive power, a damping element is provided in the small signal path that reduces the power further.

The test pulse is irradiated by a transmitting antenna, for example the body coil 14, into the patient tunnel 16 in which the local coil 50 is arranged appropriate to the application. A separate transmitting antenna 70 for the test pulse, as is shown by way of example in FIG. 1, may be used.

The controller 23 is also configured to receive the test pulse via the radio frequency unit 22 and the local coil to be tested. In one possible implementation the received signal of the test pulse is digitized and written into a memory where it is available for further processing or for analysis by the controller 23.

The controller 23 compares the received test pulse with a predetermined pulse response. The comparison may include an amplitude comparison with a threshold value or also a comparison of the curve with a curve of the predetermined pulse response predefined in a table or by a function. Individual examples are specified below in relation to the individual test scenarios.

If the received test pulse deviates from the predetermined amplitude, the controller 23 emits a warning signal. The warning signal may be output to a user via a display or also immediately interrupt or prevent subsequent image acquisition in order to prevent a danger to the patient.

Exceeding or falling below a threshold value or also an excessive interval between the received test pulse and the predetermined pulse response may be regarded as a deviation. The interval may be for example as the sum of the squares of the differences of the received test pulse and predetermined pulse response over the duration of the test pulse.

Different functions of the local coil 50 may be tested depending on the form and amplitude of the test pulse and the predetermined test response.

A basic function of reception via the local coil with high sensitivity may already be implemented for example by emitting a test pulse with amplitude 0. This should be taken to mean that while the transmitter is connected to the transmitting antenna for transmission of the test pulse, no periodic test signal is generated as, for example, an oscillator is separated from the output stage. Only the noise signal of the transmitter is then present at the transmitting antenna, and the noise signal is received by the local coil 50 and results in a significantly higher noise level. This may be increased with respect to a noise level by more than a factor of 10, 20, 50 or 100 without coupling the transmitter to the transmitting antenna. The expected pulse response may be, for example, a threshold value that matches the background noise of the local coil multiplied by this factor. Exceeding the threshold value indicates a function of the local coil with sufficiently high sensitivity.

The test with the amplitude may be supplemented by a further step by generating the test pulse with amplitude 0, while a detuning device of the local coil 50 is activated. Owing to the resonance of the transmitting antenna, the noise signal is spectrally concentrated at the Larmor frequency in the case of the body coil for example. If the detuning device of the local coil is activated and its resonance frequency is shifted from the Larmor frequency of the magnetic resonance tomograph, the received noise signal also drops correspondingly. The predetermined pulse response is greater in the test step than the background noise of the receiver, but smaller than without detuning, for example by a factor of 2, 5, 10, 50 or 100. If on activation of the detuning device the signal received by the local coil falls below a correspondingly lower threshold value, then, in connection with the preceding test step, proper functioning of the receive path and the detuning device may be inferred. If, on the other hand, the threshold value is not exceeded with amplitude 0 or is not fallen below with activated detuning device, the controller 23 may infer corresponding malfunctioning of receiver and/or detuning device. The controller 26 may then output a warning signal to a user acoustically or via a display and/or interrupt further image acquisition for safety reasons.

In an embodiment of the method an amplitude of the test pulse increases over the duration of the test pulse from a lower start value to a higher stop value. A linear increase in the amplitude in the form of a ramp may be used. However, other ascending curve forms may also be used. The ascending curves may also be approximated by a plurality of intermittent or stepped increases. A descending curve or sequence may also be used. The ascending form may be preferred, however, since problems with the local coil may be identified at lower powers already before secondary damage may occur at higher powers.

Depending on the equipping or control or faults of the local coil, different predetermined pulse responses may be expected in relation to the ascending curve. In the case of undisrupted local coil 50, a signal is expected as the pulse response, that, owing to the high sensitivity of the local coil 50 to MR signals, increases very quickly and as a result of overriding becomes saturated.

If a detuning device of the local coil 50 is activated by the controller 23 and the sensitivity is reduced, then as a pulse response from the controller 23 the received signal increases proportionally with the test pulse, so the quotient of received test pulse and expected value of the pulse response is constant. If the test pulse includes, for example, a ramp-like increase, then the expected value for the predetermined pulse response is also a ramp.

If without detuning in the case of a ramp-like test pulse, the received signal initially increases to become saturated only at higher transmitted levels, there is a suspicion that the detuning device is defective in the sense that, for example, a detuning diode is permanently bypassed in a partially conductive state.

Also possible in the connection is a proportional increase in the received test pulse with an even lower ascent or quotient compared to the measurement with activated detuning device. If a comparison of the received test pulse matches such a predetermined pulse response, this may be interpreted for example as a malfunction (permanent conductive state) of a safety device of the local coil 50 against induced over-voltage and the warning signal may be emitted correspondingly and/or further imaging prevented by the controller 23.

A plurality of the described test pulses may also be combined to form a single test pulse with different levels and activities of the local coil synchronized therewith. In addition to the accelerated implementation of the test, as a result of the received signal more information about the state of the local coil 50 may be obtained during the transitions and the comparison with an expected pulse response, and a warning issued or the process interrupted in the event of any faults.

For the presented fault scenarios, the continuous curve may be replaced for example in the form of a ramp, with a plurality of discrete test levels in the test pulse. The order may also be changed, so amplitudes that do not necessarily increase monotonously follow one after another as the test pulse.

In an embodiment of the magnetic resonance tomograph the controller 23 transmits via the small signal path and the transmitting antenna a predetermined test pulse with reduced power. A predetermined, preferably periodic radio frequency signal with a frequency at or close to the Larmor frequency of the magnetic resonance tomograph is regarded as a test pulse of reduced power. The signal lies above the noise signal of the output stage, for example by more than 6 dB, 12 dB, 24 DB or 40 dB. In an embodiment the test pulse is constant, e.g. it includes a constant frequency and/or amplitude.

The test pulse is received again via the local coil. The controller 23 compares the received test pulse with predetermined values or value ranges. For example, with an activated detuning device a significantly lower amplitude value of the received test pulse is expected while with a deactivated detuning device a significantly higher input value is expected, for example more than 20 dB, 40 dB or 60 dB above that with an active detuning device. The small signal path, in the lower power range, that is below the linearity range of the power output stage, allows the test pulse to be controlled significantly more accurately and, as a result, malfunctioning of the different active and passive detuning devices to be identified and differentiated.

If the magnetic resonance tomograph includes a directional coupler for monitoring the transmit signal, then the directional coupler may also have a defect that would in turn threaten the safety of the patient. The powers decoupled by the directional coupler are very small compared to the powers supplied to the body coil 14 during the excitation pulse. Test pulses with very low power are also necessary to test the transmission monitoring. In an embodiment the magnetic resonance tomograph includes a test switch with a signal link to the small signal path and the directional coupler. The controller 23, using the test switch, may supply a test signal from the small signal path into the receive signal path of the directional coupler and compare an output signal of the directional coupler with a predetermined value. Malfunctioning of the directional coupler or the evaluation circuit connected thereto may be identified as a result.

Figure 2:
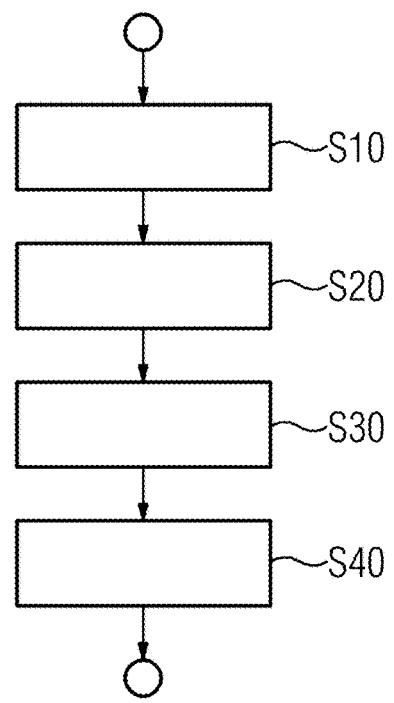
FIG. 2 depicts an example schematic flowchart of a method.

FIG. 2 depicts another schematic flowchart for a method.

In a step (S10) the transmitter transmits a predetermined test pulse with reduced power, for example via the antenna. The predetermined test pulse may be for example a noise signal of the power amplifier or a signal supplied via the small signal path.

In a step (S20) the local coil 50 receives the test pulse and forwards the signal to the controller 23. The local coil 50 may process and/or digitize the received test pulse. A receiver of the magnetic resonance tomograph 1 may also be used that passes the signal to the controller for evaluation. The received test pulse may be stored as a sequence of values in a memory with access by the controller 23.

In a step (S30) the controller 23 compares the received test pulse with a predetermined pulse response. The comparison may be a comparison with a threshold value or the determination of an interval of the received test pulse from a predetermined pulse response. Predetermined admissible value ranges for the pulse response or the received test signal are also conceivable.

In a step (S40) the controller 23 emits a warning signal, for example acoustically or on a display, or by way of the warning signal interrupts an image acquisition process of the magnetic resonance tomograph if the received test signal deviates from the predetermined pulse response. Depending on test pulse and malfunctioning to be investigated, a deviation may be exceeding or falling below the threshold values or an excessive deviation from the predetermined pulse response. The predetermined pulse response may lie within or outside of a predetermined value range for the pulse response.

Figure 3:
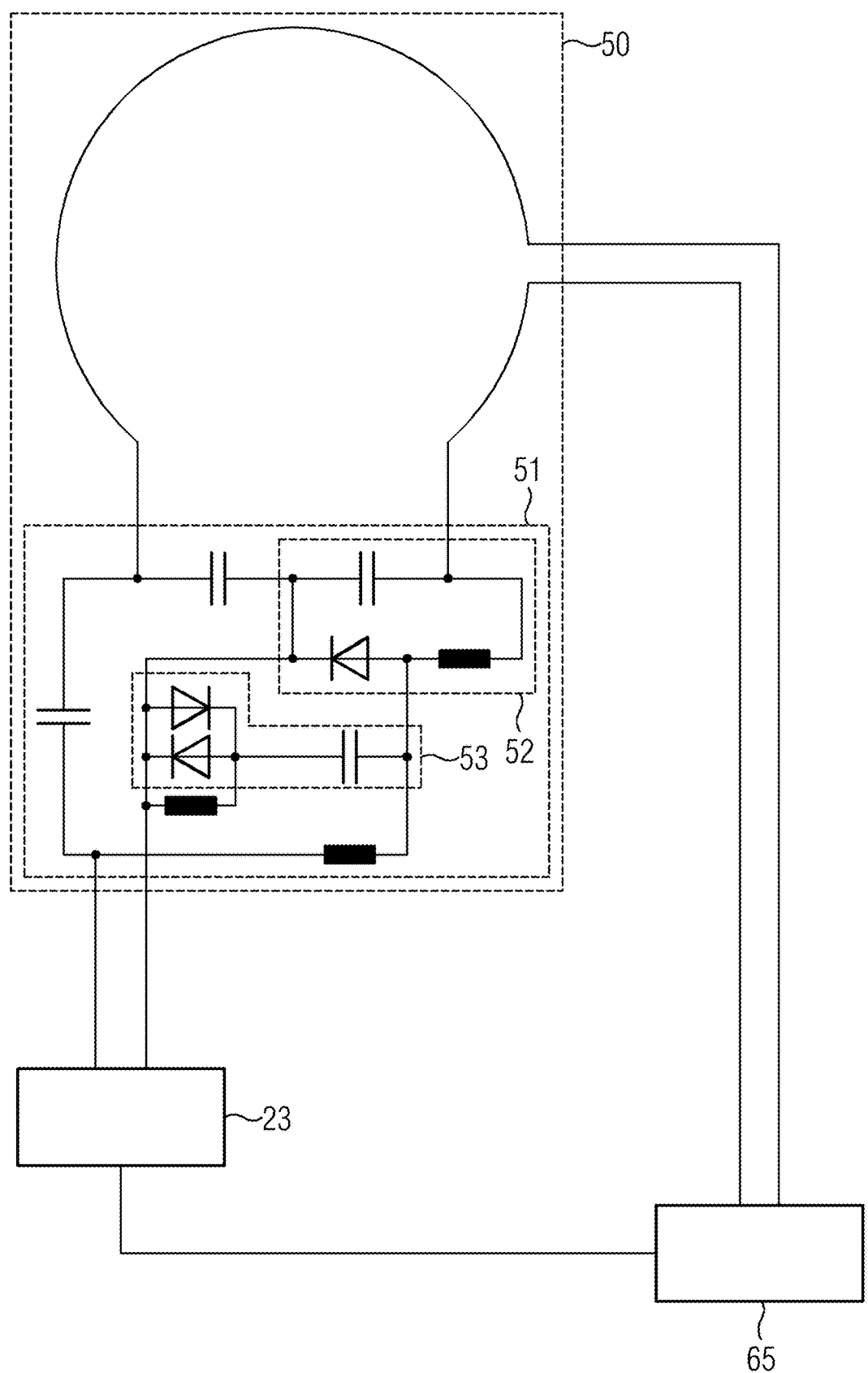
FIG. 3 depicts an example schematic representation of a test device of a magnetic resonance tomograph.

Elements of the test device necessary for an embodiment of the method are depicted schematically in FIG. 3.

The local coil 50 includes a detuning device 51 to prevent excessively high currents due to induction from flowing in an antenna coil of the local coil 50 during an excitation pulse for the nuclear spins and/or to prevent excessively high voltages from being induced that may damage the local coil and, for example due to voltage or heat buildup, also endanger the patient. The detuning device 50 may include both a passive detuning 53 and an active detuning 52. The passive detuning takes place for example by way of two antiparallel switched diodes, so in the case where the induced alternating voltage exceeds the threshold voltage of the diodes, the two antiparallel switched diodes become conductive and an additional LC member is looped in series into the antenna coil, so the resonance frequency is changed and the induced voltage limited.

The active detuning 52 takes place by way of a PIN diode, that may be loaded by the controller with a reverse voltage and/or a forward current, so detuning takes place due to the changed junction capacitance or due to the switching effect in connection with a capacitance and/or inductance connected in series or in parallel.

Other circuits and combinations of the elements of the detuning device 51 may be used. For example, it is also possible to carry out active detuning 52 and passive detuning 53 separately without shared paths or components. One object of the method and of the magnetic resonance tomograph is to be able to check the function of as many components as possible or of all components.

FIG. 4 depicts an embodiment of the method schematically in a flowchart.

In relation to the method it is provided that in a step S5 the detuning device of the antenna coil, for example the local coil 50, is activated by a test control. The test control may be the controller 23 of the magnetic resonance tomograph 1, implemented by a corresponding program or program module. Dedicated processors or a logic circuit such as an FPGA may be used. On activation, an active detuning 52 is controlled such that a local coil 50 electrically connected to the active detuning 52, or for example also a body coil 14, in the activated state no longer at the optimum frequency for reception, includes a resonance. The optimum frequency is conventionally the Larmor frequency of the nuclear spins to be investigated in the static magnetic field BO of the magnetic resonance tomograph 1. In different embodiments of the method the active detuning 52 may be activated at different instants and not just at the start as depicted in FIG. 3.

Common to the different embodiments of the method is that in a step S20 and in a step S50 a second receive signal is received with a receiver at two different instants. Different instants are regarded as being for example when a further step of the method takes place between step S20 and S50 or at least the received signal changes between the steps S20 and S50 due to physical conditions, for example owing to damping or a decaying excitation. The two instants of the steps S20 and S50 differ, for example, by more than 1 ms, 5 ms, 10 ms, 50 ms, or 100 ms.

In a step S60 the test control compares the first receive signal with the second receive signal. Comparison may be regarded, for example, as a calculation of the difference in the amplitudes or squared amplitudes of the two receive signals. Calculation of the phase difference or a spectral analysis of the energy distribution over a plurality of or a large number of frequencies may be performed. Functions applied thereto, such as logarithmizing, may form part of the comparison.

In a step S70 a warning signal is emitted if the result of the comparison does not match a predetermined relation for the first receive signal to the second receive signal. Individual examples for signals and expected predetermined relations are disclosed hereinafter. The warning signal may be output to a user via an output or also directly to the control unit 20, so the latter interrupts further image acquisition, for example, to not endanger a patient 100 as a result of a defective detuning device 51.

Step S70 may also be regarded as an expanded implementation of step S30 in FIG. 2, with the predetermined pulse response being the other received test pulse.

In one embodiment of the method it is provided that in a step S30 the detuning device is deactivated by the test control. One of the two receive signals is received with activated active detuning 52 while the other receive signal is received with deactivated active detuning 52. Step S10 may take place for example before step S20 and step S30 between step S20 and S50. The magnetic resonance tomograph 1 may not emit an active signal during steps S20 and S50, e.g. the radio frequency unit 22 and/or a test transmitter 60 is/are not controlled by an input signal. The receive signal may be characterized for example by a noise signal of an output stage of the transmitter. In step S60 of the comparison the noise level of the first receive signal is compared with the noise level of the second receive signal. As a result of the active detuning 52 the level and the energy of the receive signal received by the receiver 65 change characteristically. This may be connected or caused by a changed resonance frequency of the antenna or local coil 50. The comparison may consider a change in the spectral distribution of the noise signal, for example by FFT, that results due to a convolution of spectrum of the noise source with resonance frequency of the antenna, that is in turn changed by the active detuning. The amplitude of the noise signal is so small that passive detuning 53 does not occur and solely the functioning of the active detuning 52 may be checked.

In one embodiment of the method a transmitter of the magnetic resonance tomograph emits a small signal during the steps of reception S20, S50, which signal is configured to not override the receiver.

The transmitter may be the transmitter that is used by the magnetic resonance tomograph to generate the excitation pulse for the nuclear spins on image acquisition. The transmitter is conventionally configured to generate extremely strong radio frequency pulses in the range of a few hundred watts to thousands of watts with high efficiency. To generate small signals, that do not override the receiver 65, the magnetic resonance tomograph may have a linear output stage and a switchable damping device between a signal generation and the linear output stage, that, during the steps of reception S20, S50, damps an input signal of the linear output stage enough to generate a correspondingly small signal at the output of the linear output stage. The output signal of a conventional power output stage may be damped, although a high power would have to be discharged as the dissipation loss of the damping element.

The generated small signal may be emitted for example via the body coil 14 as transmitting antenna into the patient tunnel 16 with the local coil 50 as receiving antenna.

A separate test transmitter 60 as part of the magnetic resonance tomograph 1 may be used that controlled by the test control generates the small signal and emits the small signal via transmitting antenna 70 into the patient tunnel 16 with the local coil 50.

Active generation of the small signal gives more degrees of freedom in the method on comparison of the first receive signal and the second receive signal as the power and/or the frequency spectrum changes between step S20 and step S50. For example, the power of the small signal may change so much between step S20 and S50 that passive detuning 53 already engages at the higher power and the level of the receive signal is limited. The function of the passive detuning 53 may be checked using the limitation or a non-linearity with three or more measured values.

A spectral distribution of the small signal may be changed between the steps to test a function of an active detuning 52 and/or passive detuning 53. Various combinations of different small signals and settings of the active detuning may be used that all check functions of the detuning device 51.

The nuclear spins may be sued as the small signal source after an excitation. For example, a measured value from a preceding image acquisition sequence may be used to estimate the strength of an expected magnetic resonance signal as well as its temporal curve. With a known spin density and excitation signal, a Bloch simulation of the expected magnetic resonance signal may be performed. A typical curve is an exponential drop in the magnetic resonance signal. The steps already described may likewise be carried out by the small signal with known temporal curve, for example, checking of the active detuning 53, that, in contrast to passive detuning, does not require a minimum amplitude of the small signal for the reaction of the detuning.

The nuclear spins may also be provided by a phantom. With a low signal strength, the patient may be used as the source of the magnetic resonance signal. Passive resonators could also be used such as an oscillating circuit or dipole that are excited by an excitation pulse of the radio frequency unit 22 and have an exponential signal drop predetermined by the quality of the oscillating circuit or dipole.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a magnetic resonance tomograph, the magnetic resonance tomograph comprising a controller, a local coil, and a transmitter configured for generating an excitation pulse for nuclear spins on image acquisition and for generating and transmitting a test pulse, the method comprising:
   generating, by a signal generator of the transmitter, an input signal;
   damping, by a damping device of the transmitter, the test pulse so that a power output stage of the transmitter outputs a predetermined test pulse with reduced power;
   transmitting, by the transmitter, the predetermined test pulse with reduced power;
   receiving, by the local coil, the predetermined test pulse;
   comparing, by the controller, the received predetermined test pulse with a predetermined pulse response; and
   emitting, by the controller, a warning signal when the received predetermined test pulse deviates from the predetermined pulse response.

2. The method of claim 1, wherein the predetermined test pulse has an amplitude of 0 volt and the predetermined pulse response has an elevated noise level.

3. The method of claim 1, wherein an amplitude of the predetermined test pulse increases over a duration of the predetermined test pulse from a lower start value to a higher stop value.

4. The method of claim 3, wherein the local coil includes a detuning device and during receiving, the detuning device of the local coil is activated.

5. The method of claim 1, wherein the predetermined pulse response has a threshold value.

6. The method of claim 1, wherein the predetermined pulse response is proportional to the predetermined test pulse.

7. The method of claim 1, further comprising:
   activating a detuning device of an antenna coil;
   receiving, by a receiver, a first receive signal;
   receiving a second receive signal with the receiver;
   comparing the first receive signal with the second receive signal by a test control; and
   emitting a warning signal when the result of the comparison does not match a predetermined relation for the first receive signal to the second receive signal.

8. The method of claim 7, further comprising:
   deactivating the detuning device;
   wherein receiving of the second receive signal takes place when the detuning device is switched off and comparing comprises:
   comparing a noise level of the first receive signal is compared with the noise level of the second receive signal.

9. The method of claim 8, wherein for receiving the first receive signal and the second receive signal, the transmitter of the magnetic resonance tomograph transmits a small signal that is configured not to override the receiver.

10. The method of claim 9, wherein during the receiving of the first receive signal and the second receive signal no input signal is supplied at the power output stage of the transmitter.

11. The method of claim 7, wherein during the receiving of the first receive signal and the second receive signal, a signal source is arranged in a patient tunnel and is configured for transmitting a signal, wherein a power of the signal between reception of the first receive signal and the reception of the second receive signal changes by a predetermined size.

12. The method of claim 11, wherein the transmitter of the magnetic resonance tomograph is configured as the signal source and is configured to generate the signal, wherein the signal is a small signal that does not override the receiver, wherein a test control controls the transmitter to change the power.

13. The method of claim 11, wherein the signal source is a passive signal source that is excited by the magnetic resonance tomograph for emitting a small signal, wherein between reception of the first receive signal and reception of the second receive signal, an amplitude of the small signal emitted by the signal source drops over time in a predetermined manner.

14. A magnetic resonance tomograph comprising:
   a controller;
   a local coil;
   a transmitter comprising an power output stage and a switchable damping device configured to damp an input signal of the power output stage; and
   a transmitting antenna for transmitting excitation pulses,
   wherein the controller is configured via the transmitter and the transmitting antenna, to induce transmission of a predetermined test pulse with reduced power;

wherein the controller is also configured to receive the test pulse via the local coil;

wherein the controller is configured to compare the received test pulse with a predetermined pulse response and to emit a warning signal when the received test signal differs from the predetermined pulse response.

15. The magnetic resonance tomograph of claim 14, wherein the transmitter includes a small signal path that provides a direct supply of a small signal into the transmitting antenna.

16. The magnetic resonance tomograph of claim 15, wherein the small signal path provides a direct connection between a radio frequency source of the transmitter to the transmitting antenna by avoiding the power output stage.

17. The magnetic resonance tomograph of claim 16, wherein the small signal path comprises a small signal amplifier.

18. The magnetic resonance tomograph of claim 15, wherein the controller is further configured to induce via the small signal path and the transmitting antenna emitting of a predetermined test pulse with reduced power.

19. The magnetic resonance tomograph of claim 15, wherein the magnetic resonance tomograph further comprises:
a directional coupler; and
a test switch including a signal link to the small signal path and the directional coupler;
wherein the controller is configured to supply a test signal from the small signal path via the test switch into the directional coupler and to compare an output signal of the directional coupler with a predetermined value.

20. The magnetic resonance tomograph of claim 14 further comprising:
a test device configured for testing a detuning device of an antenna coil of the magnetic resonance tomograph;
wherein the test device comprises a test control and the test control is configured to activate the detuning device of the antenna coil, receive a first receive signal with a receiver, receive a second receive signal with the receiver, compare the first receive signal with the second receive signal, and to output a warning signal when the result of the comparison does not match a predetermined relation for the first receive signal to the second receive signal.

21. The magnetic resonance tomograph of claim 20, wherein the magnetic resonance tomograph further comprises:
a transmitter configured to generate excitation pulses with the switchable damping device and the test control is further configured, during reception of the first receive signal and second receive signal, to transmit a small signal with the aid of the transmitter and the damping device, that is configured to not override the receiver.

22. The magnetic resonance tomograph of claim 20, wherein the magnetic resonance tomograph further comprises:
an active signal source that during reception, is arranged in a patient tunnel and transmits a signal, wherein the test control is configured to change the power of the signal between reception of the first receive signal and reception of the second receive signal by a predetermined size.

23. A non-transitory computer implemented storage medium that stores machine-readable instructions executable by at least one processor, the machine-readable instructions comprising:
generating, by a signal generator of a transmitter configured for generating an excitation pulse for nuclear spins on image acquisition and for generating and transmitting a test pulse, an input signal;
damping, by a damping device of the transmitter, the test pulse so that a power output stage of the transmitter outputs a predetermined test pulse with reduced power;
transmitting the predetermined test pulse with reduced power;
receiving the predetermined test pulse;
comparing the received predetermined test pulse with a predetermined pulse response; and
emitting a warning signal when the received predetermined test pulse deviates from the predetermined pulse response.

* * * * *